(12) United States Patent
Lebauer

(10) Patent No.: US 7,984,804 B2
(45) Date of Patent: Jul. 26, 2011

(54) PORTABLE PROTECTIVE CONTAINER FOR ELECTRONIC DEVICES IN CONJUNCTION WITH A MULTIFUNCTION POCKET TOOL

(76) Inventor: Ian F. Lebauer, Maple Lake, MN (US)

(*) Notice: Subject to any disclaimer, the term of this patent is extended or adjusted under 35 U.S.C. 154(b) by 0 days.

(21) Appl. No.: 12/637,507

(22) Filed: Dec. 14, 2009

(65) Prior Publication Data

US 2010/0147710 A1    Jun. 17, 2010

Related U.S. Application Data

(60) Provisional application No. 61/201,474, filed on Dec. 12, 2008.

(51) Int. Cl.
*B65D 85/00* (2006.01)
*B65D 71/00* (2006.01)
*G01K 1/08* (2006.01)

(52) U.S. Cl. .................. 206/320; 206/234; 374/141

(58) Field of Classification Search .............. 206/38, 206/234, 305, 320; 7/118, 164–165, 167–168; 30/155; 361/679.02–679.56; 374/141–143, 374/152, 208; 455/344–349, 899
See application file for complete search history.

(56) References Cited

U.S. PATENT DOCUMENTS

| | | | | |
|---|---|---|---|---|
| 2,371,308 A | * | 3/1945 | Mosch | 206/234 |
| 2,412,056 A | * | 12/1946 | Mosch | 206/234 |
| 2,630,212 A | * | 3/1953 | Mosch | 206/234 |
| 2,993,586 A | * | 7/1961 | Mosch | 206/38 |
| 4,478,330 A | | 10/1984 | Lin | |
| 4,854,045 A | * | 8/1989 | Schaub | 455/344 |
| 6,044,967 A | | 4/2000 | Painsith | |
| 6,145,994 A | | 11/2000 | Ng | |
| 6,257,405 B1 | | 6/2001 | Painsith | |
| 6,527,112 B2 | | 3/2003 | Painsith | |
| 6,536,589 B2 | | 3/2003 | Chang | |
| 6,571,940 B2 | | 6/2003 | Newman | |
| 6,619,225 B1 | * | 9/2003 | Presniakov et al. | 7/118 |
| 6,648,139 B2 | | 11/2003 | Fisher, Jr. et al. | |
| 6,701,159 B1 | | 3/2004 | Powell | |
| 6,772,879 B1 | | 8/2004 | Domotor | |
| 6,892,880 B2 | | 5/2005 | Nieves | |
| 7,036,174 B2 | | 5/2006 | Painsith et al. | |
| 7,073,918 B1 | * | 7/2006 | Bauman | 7/118 |
| 7,125,145 B2 | * | 10/2006 | Gardiner et al. | 7/164 |
| 7,146,667 B2 | * | 12/2006 | Elsener | 7/118 |
| 7,290,953 B2 | | 11/2007 | Regala | |
| 7,306,366 B1 | * | 12/2007 | Camenzind et al. | 374/141 |
| 7,344,023 B2 | | 3/2008 | Painsith et al. | |
| 7,431,161 B2 | | 10/2008 | Carlino | |
| D581,155 S | | 11/2008 | Richardson et al. | |
| D581,421 S | | 11/2008 | Richardson et al. | |
| 7,495,895 B2 | | 2/2009 | Carnevali | |
| D589,016 S | | 3/2009 | Richardson et al. | |
| 7,500,858 B2 | | 3/2009 | Emerson et al. | |
| 7,540,379 B2 | | 6/2009 | Yau | |
| 7,594,576 B2 | | 9/2009 | Chen et al. | |
| 7,609,512 B2 | | 10/2009 | Richardson et al. | |
| 2001/0047946 A1 | | 12/2001 | Painsith | |
| 2002/0101411 A1 | | 8/2002 | Chang | |
| 2005/0139498 A1 | | 6/2005 | Goros | |
| 2009/0265860 A1 | * | 10/2009 | Barber et al. | 7/167 |

* cited by examiner

*Primary Examiner* — Bryon P Gehman
(74) *Attorney, Agent, or Firm* — Kinney & Lange, P.A.

(57) ABSTRACT

A protective container for a portable electronic device includes a plurality of storage compartments formed in a rear wall, or a tool carrier with tool compartments mounted to the rear wall. Generally flat tools are stored within the compartments and are extractable to allow the protective container and portable electronic device to function as a multifunction pocket tool.

12 Claims, 6 Drawing Sheets

PORTABLE PROTECTIVE CONTAINER FOR ELECTRONIC DEVICES IN CONJUNCTION WITH A MULTIFUNCTION POCKET TOOL

CROSS-REFERENCE TO RELATED APPLICATION(S)

This application claims the benefit of U.S. Provisional Patent Application No. 61/201,474, filed Dec. 12, 2008, which is incorporated by reference.

BACKGROUND OF THE INVENTION

The primary purpose of a container for an electronic device is to protect the device from wear and also to help prevent it from shock if the case with the electronic device therein is dropped. Generally, the containers are designed to be lightweight and form fitting to the electronic device so that a user can easily port their electronic device comfortably in a pocket or handbag without strain or additional bulk. Electronic device containers are numerous and varied in design including: various covers for the device and its relational interface, structural portions and purposeful cushioning areas; all of which serve the sole purpose of enabling the user to more safely port the electronic device for daily use and in travel without damage and without interference with the utility of the device.

The primary purpose of a multifunction pocket tool is to provide the user with immediate and direct access to various and frequently needed tools by means of a small compact and portable instrument. Certain tools are often needed in situations where it is impractical or at least inconvenient to go prepared with a well equipped tool box. For example, hunters, fishermen campers, bicyclists, motorcyclists, automobilists and even occupational people such as doctors, lawyers, business people and students have frequent need for a variety of common tools which are often not available when the need arises. Prior art shows that typically multifunction pocket tools have two lateral sidepieces serving as a handle for the tool and a plurality of tools disposed between the sidepieces. A multifunctional pocket tool is understood to mean, for example, a multifunction pocket knife such as the so-called "Swiss army knife," a polyvalent penknife, or a closing knife. The application also applies to sliding-blade knives such as switchblade knives, or to multifunction pocket tools without any knife. Multifunction pocket tools heretofore proposed have not satisfactorily addressed an issue of the modern user, who, burdened with a necessity for carrying numerous other objects, such as: a wallet, keys, a cellular phone, a music playback device, personal digital assistant (PDA), and or other portable electronic devices, is unlikely willing or able to carry any additional objects, like a multifunction pocket tool, however useful and portable it might be.

BRIEF SUMMARY OF THE INVENTION

The present invention offers a user the ability to carry a portable electronics device in a case or container that additionally houses a multifunction pocket tool, whereby the user in effect can carry only one item and yet have the full benefit of two.

DETAILED DESCRIPTION OF THE INVENTION

Embodiments of the invention include a container that is to be relatively form fitted to a portable electronic device (such as a cell phone, personal digital assistant, MP-3 player, iPod, or the like) by means of a structure with at least one side, that encompasses all or a portion of a portable electronic device. The container may affix to the portable electronic device through a plurality of means including but not limited to: adhesive, an openable and closeable enclosure or by means of a structure that affixes through tension and friction. One or more sides of the container is attached to one or more useful tools, or a compartment is provided in the container in which to carry one or more useful tools such as: scissors, a nail file, tweezers, etc. The tools can be attached to the container in various ways including one in which they are affixed through a single rivet or bolt whereupon the working portion of the tool can rotate in and out of a portion of the container by pivoting on the single fastener. The tool or tools must only slightly protrude from the container when not in use or in the closed position and may not otherwise interfere with the relatively form fitting nature of the container with relation to the portable electronic device or the utility of the portable electronic device.

Figure 1:
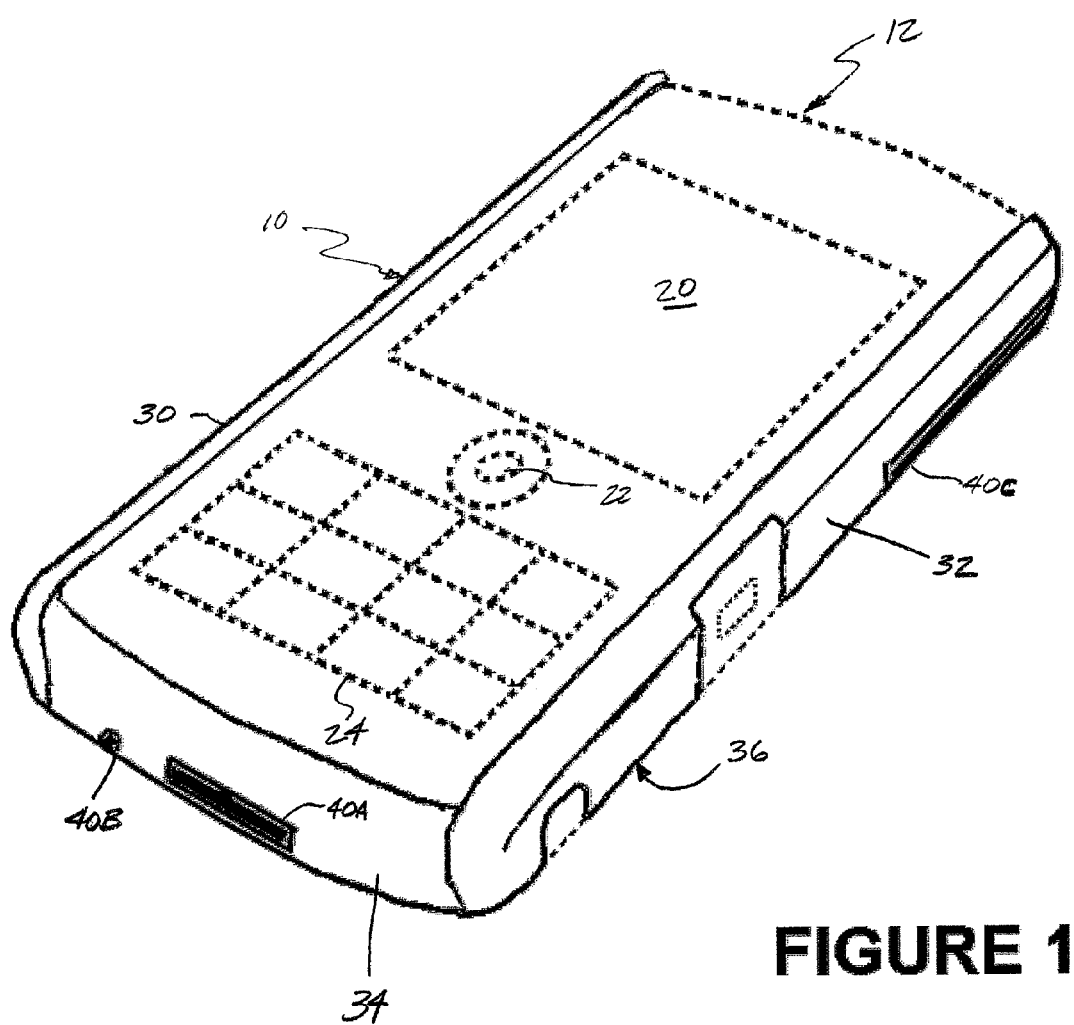
FIG. 1 is an isometric front view of an embodiment of the present invention in its mode as a portable electronics device container and in its mode as a multifunction pocket tool in the closed position.
Figure 2:
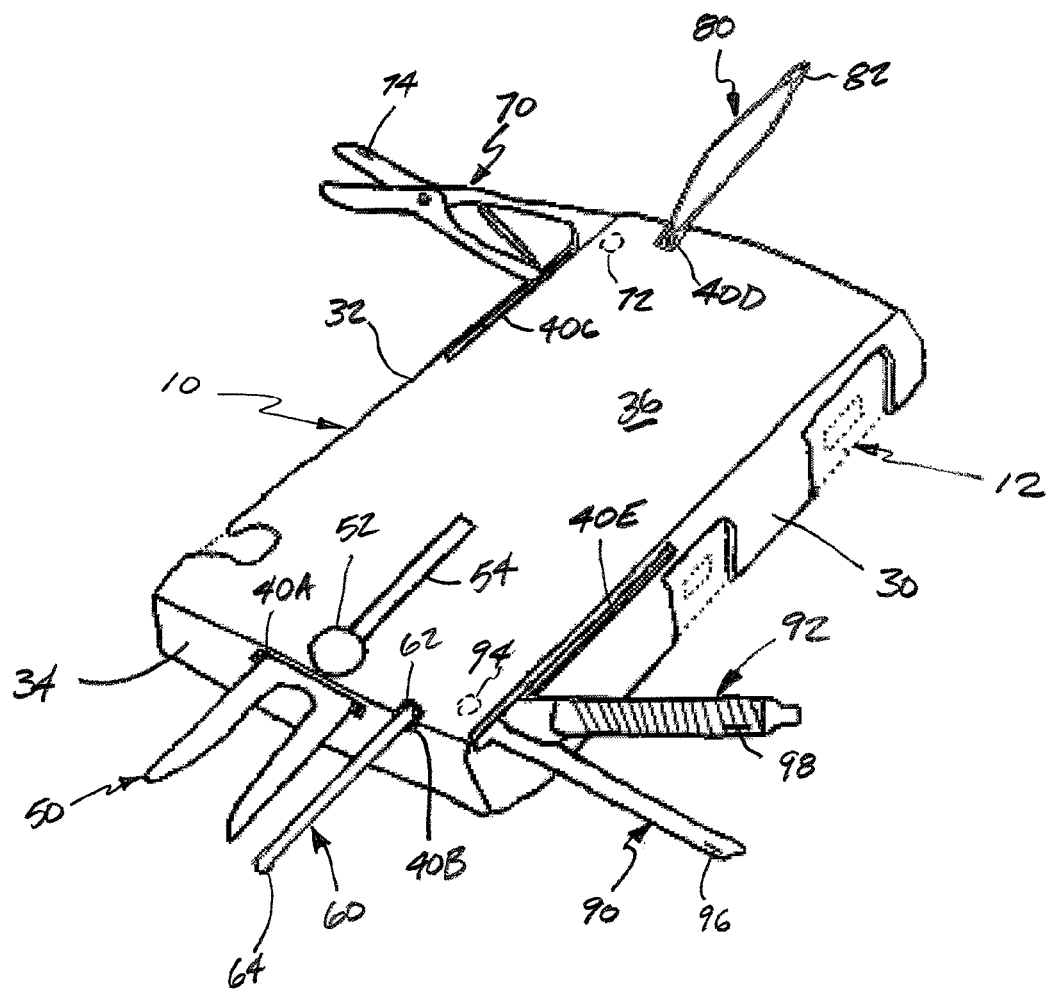
FIG. 2 is an isometric rear view of an embodiment of the present invention in its mode as a portable electronics device container and a multifunctional pocket tool in the opened position.

FIGS. 1 and 2 show protective container 10 mounted on portable electronic device 12. Protective container 10 serves two functions: first, it provides cover and cushioning to protect portable electronic device 12 from wear and from shock if dropped. Second, container 10 houses various tools which allow container 10 and portable electronic device 12 to function together as a multifunction tool.

FIG. 1 shows a front view of protective container 10 and portable electronic device 12 in the normal mode, in which the tools are tucked away within protective container 10, so that the multifunction tool is in a closed or nondeployed condition. FIG. 2 is a rear view of protective container 10 and portable electronic device 12 in which all of the various tools have been extracted for use.

In FIGS. 1 and 2, portable electronic device 12 is illustrated as a cell phone or PDA. The front face of device 12 includes display 20, track ball 22 and keyboard 24. Various user controls and ports along the sides and ends of device 12 are exposed by cutouts or access ports in protective container 10.

Protective container 10 includes left sidewall 30, right sidewall 32, end wall 34, and rear wall 36 (shown in FIG. 2). In this embodiment, protective container 10 is in the form of a sleeve that is mounted around the rear surface, sides, and lower end of portable electronic device 12. In this embodiment, contact between protective container 10 and portable electronic device 12 can be maintained by a friction fit, although a fastener or adhesive can also be used to maintain connection between protective container 10 and portable electronic device 12.

Built into container 10 are storage compartments 40A-40E. Storage compartments 40A and 40B open where end wall 34 meets rear wall 36. Storage compartment 40C opens as an elongate slot in the upper rear portion of right sidewall 32. Storage compartment 40D opens at the upper end of rear wall 36, as shown in FIG. 2. Compartment 40E opens as an elongated slot in the lower rear portion of left sidewall 30, as illustrated in FIG. 2.

The tools stored within storage compartments 40A-40E are generally flat or thin tools, which can fit into storage compartments having a reduced height. This maintains the generally low profile of protective container 10 and portable electronic device 12.

FIG. 2 illustrates protective container 10 with all of the various tools extracted or deployed from storage compartments 40A-40E. At any one time, of course, a user may only wish to make use of one of the various tools shown in FIG. 2. FIG. 2, divot repair tool 50 is shown with its tines extending from the open end of compartment 40A. Divot repair tool 50 is moved between the stored position within compartment 40A and the deployed position shown in FIG. 2 by the use of button 52, which moves in slot 54 in rear wall 36 of protective container 10. Button 52, when acted upon (pressed and slid) by user, unlocks and loosens tool 50, so that button 52 can be moved toward end wall 34. At the end of its travel toward end wall 34, button 52 again locks in place in slot 54, so that tool 50 will not retract without unlocking button 52 and sliding button 52 along slot 54 until tool 50 is retracted into compartment 40A.

Tool 60 is a stylus or toothpick, depending upon point 62 at its distal end. Head 64, at the proximal end of tool 60, fits into the opening of compartment 40B with a friction and snug fit, so that tool 60 will not fall out during normal use of container 10 and device 12. Tool 60 can be removed by gripping an edge or a portion of head 64 that protrudes from the opening of compartment 40B. This allows tool 60 to be pulled out of compartment 40B for use.

Compartment 40C houses scissors 70. One arm of the scissor's handle is pivotally attached to rear wall 36 of container 10 by a single bolt or rivet 72. Scissors 70 can be extracted from compartment 40 by gripping groove 74 at the distal end of scissors 70 and pivoting scissors 70 outward about a pivot axis defined by bolt or rivet 72. After use, scissors 70 is pivoted back into storage container 40C.

Compartment 40D houses tweezers 80. Head 82 at the proximal end of tweezers 80 is accessible at the opening of compartment 40D. Head 82 can be grasped and pulled outward to remove tweezers 80 entirely from compartment 40D. After use, tweezers 80 are compressed and inserted into the opening of compartment 40D and pushed into compartment 40D by applying force to head 82.

Compartment 40E contains two different tools, knife 90, and nail file 92. Both knife 90 and nail file 92 are pivotally connected to rear wall 36 of container 10 by a single bolt or rivet 94. Knife 90 and nail file 92 can be extracted from compartment 40E by grasping grooves 96 and 98, respectively, at their distal ends and pivoting them outward as shown in FIG. 2. Knife 90 and nail file 92 are reinserted by pivoting them back toward rear wall 36 until their distal ends enter the upper end of the opening of compartment 40E.

When one or more tools 50, 60, 70, 80, 90, and 92 are extracted from container 10, as illustrated in FIG. 2, portable electronic device 12 and container 10 together have utility as a multifunction pocket tool. When the tools are inserted back into their respective compartments (as shown in FIG. 1), device 12 and container 10 provide a convenient way to carry a multifunction tool without adding additional bulk or weight.

The low profile tools, in conjunction with the small height of the storage compartments, allow portable electronic device 12 and protective container 10 to maintain a convenient size and weight. Multifunction pocket tool capabilities are provided without sacrificing convenience of the portable electronic device and without sacrificing the protection as provided for that device by container 10.

Figure 3:
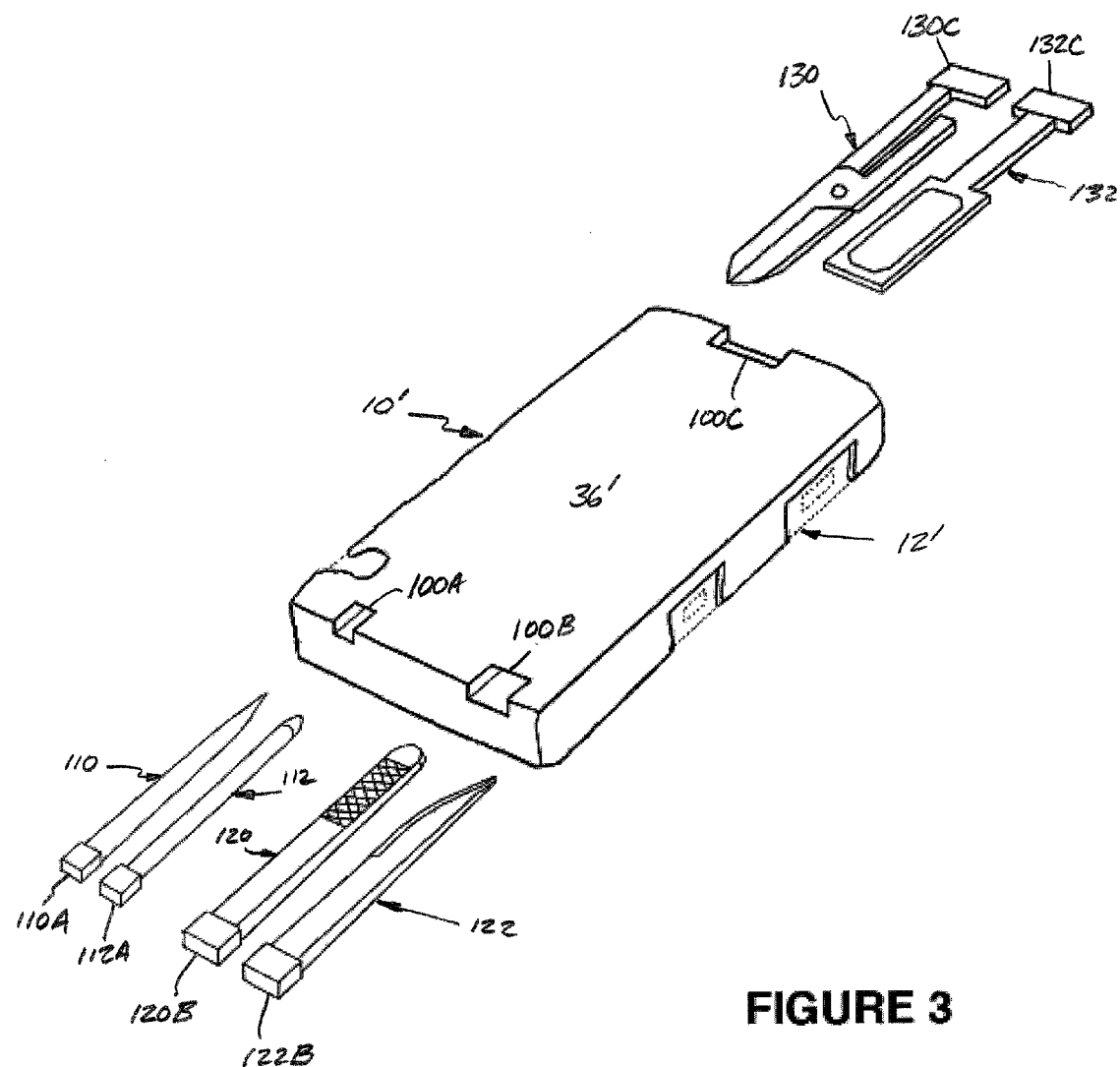
FIG. 3 is an isometric rear view of another embodiment of the present invention illustrating a portable electronics device container that includes standardized size cavities in which any one of multiple tools corresponding to the standardized size cavity may be stored.

FIG. 3 shows another embodiment of the protective container of the present invention which makes use of storage compartments having openings of standardized size. For each standardized size, a number of different tools are shaped to fit interchangeably in that particular compartment. In other words, for each standardized opening size, there is a corresponding standardized tool size that is common to a set of different tools. This allows a user to select the particular tools that are of interest, rather than purchasing a protective container, only to find that some of the tools are useful, while others are of limited or no use to that user.

In the embodiment illustrated in FIG. 3, an isometric view of the rear side of protective container 10' is shown. Protective container 10' is mounted on portable electronic device 12'. The embodiment shown in FIG. 3, rear wall 36' contains compartments 100A, and 100B, which open at the lower end of rear wall 36', and compartment 100C which opens at the upper end of rear wall 36'. Compartments 100A-100C may have the same height, but have different widths. In addition, they may have different lengths, depending upon the tools they receive. In this embodiment, compartment 100A has standard opening size A, compartment 100B has standard size B which is larger than size A, and compartment 100C has standard size C, which is larger than size A and B. The size of compartments 100A-100C are standardized, so that each particular size accommodates a different set of tools. Any tool from a particular set having a head with size A, for example, may be received by compartment 100A. As shown in FIG. 3, two different tools, toothpick 110 and stylus 112 have heads 110A and 112A, respectively, with size A. As a result, either of tools 110 and 112 will fit in compartment 100A. Head portion 110A, 112A of each tool is sized to be received in and snuggly held at the opening of compartment 100A.

Nail file 120 and knife 122 have heads 120B and 122B, so that either tool 120 or 122 can be received in compartment 100B. Heads 120B and 122B are sized to mate with and be snuggly held in the opening of compartment 100B.

Compartment 100C has opening size C, which will accommodate heads 130C and 132C of scissors 130 and magnifying glass 132. Either tool 130 or 132 can fit into compartment 100C.

In the embodiment shown in FIG. 3, only one compartment of each standard opening size A, B, C is shown, and only two tools are shown for each standard opening size. In other embodiments, however, multiple compartments of the same standard opening width can be provided, and different numbers of compartments can be used.

Although FIG. 3 shows only two different tools for each sized compartment, there is no limit to the number of different tools that can be used with a particular compartment opening size. The standard opening size may be defined by its width, its height, its depth, or a combination of those dimensions. The set of tools that may be used interchangeably with a particular opening size have a standardized tool size that may be due to a head dimension or may be due to dimensions of another portion of the tool. In some cases, the tools may not have a head, but still have a standard tool size compatible with one of the standardized opening sizes. The use of interchangeable tools for each standard opening size allows a user to personalize the set of tools associated with his or her portable electronic device and protective container.

Figure 4:
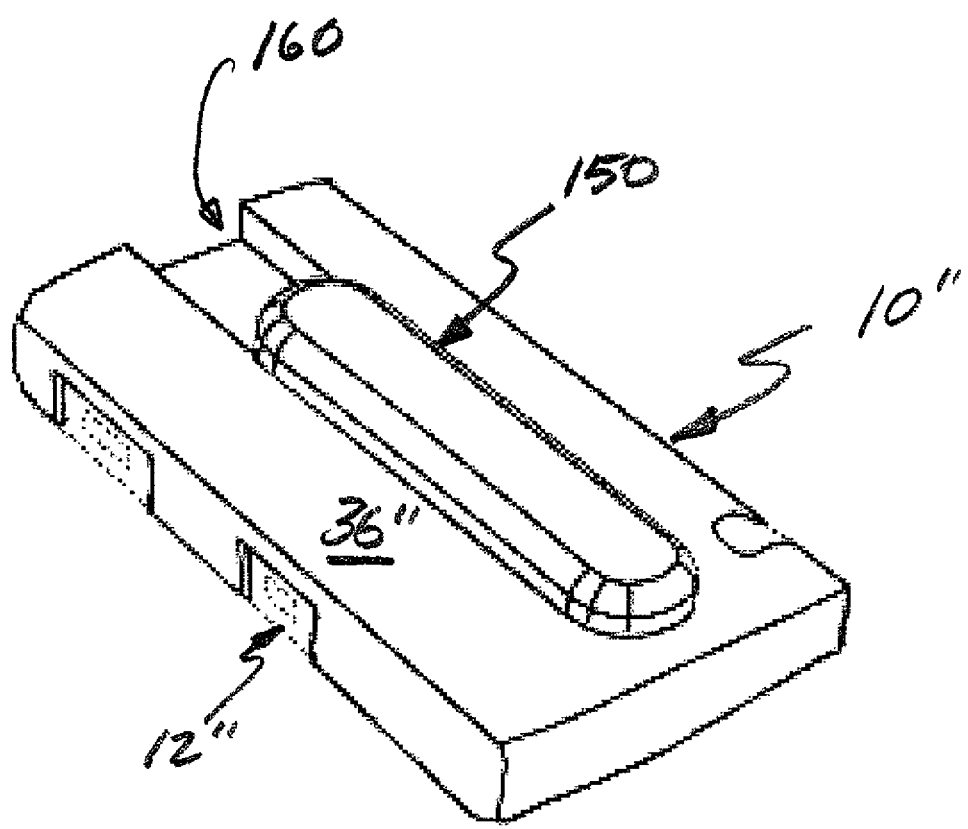
FIGS. 4-6 show another embodiment in which the portable electronics device container includes a compartment or recess for receiving and holding a device containing multiple tools.
Figure 5:
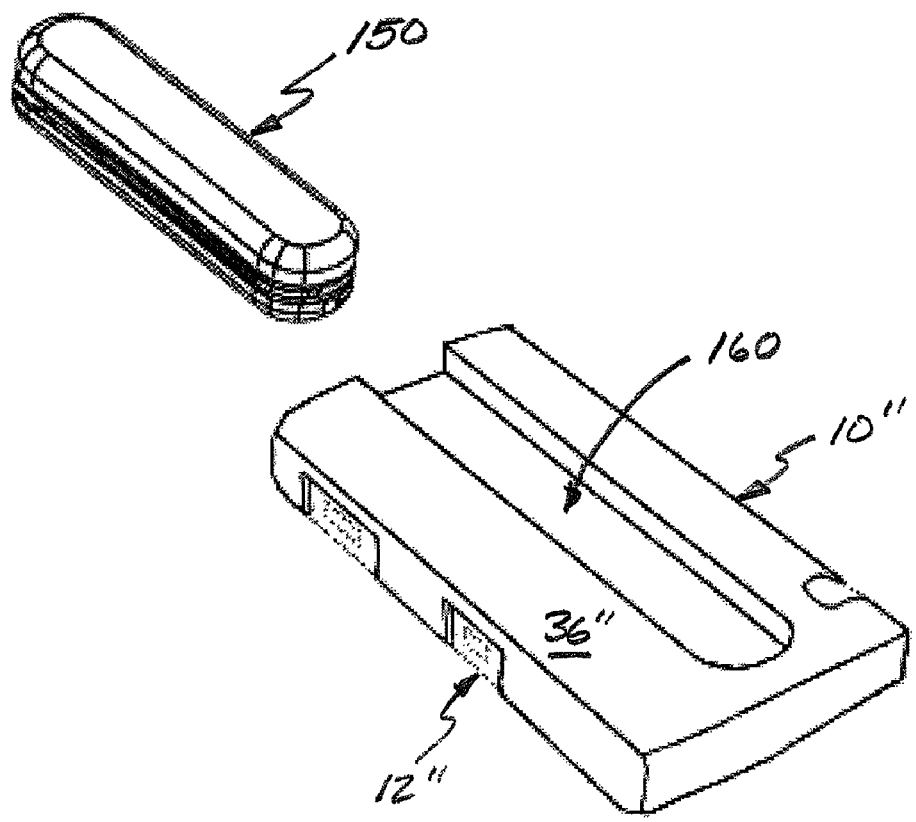
Figure 6:
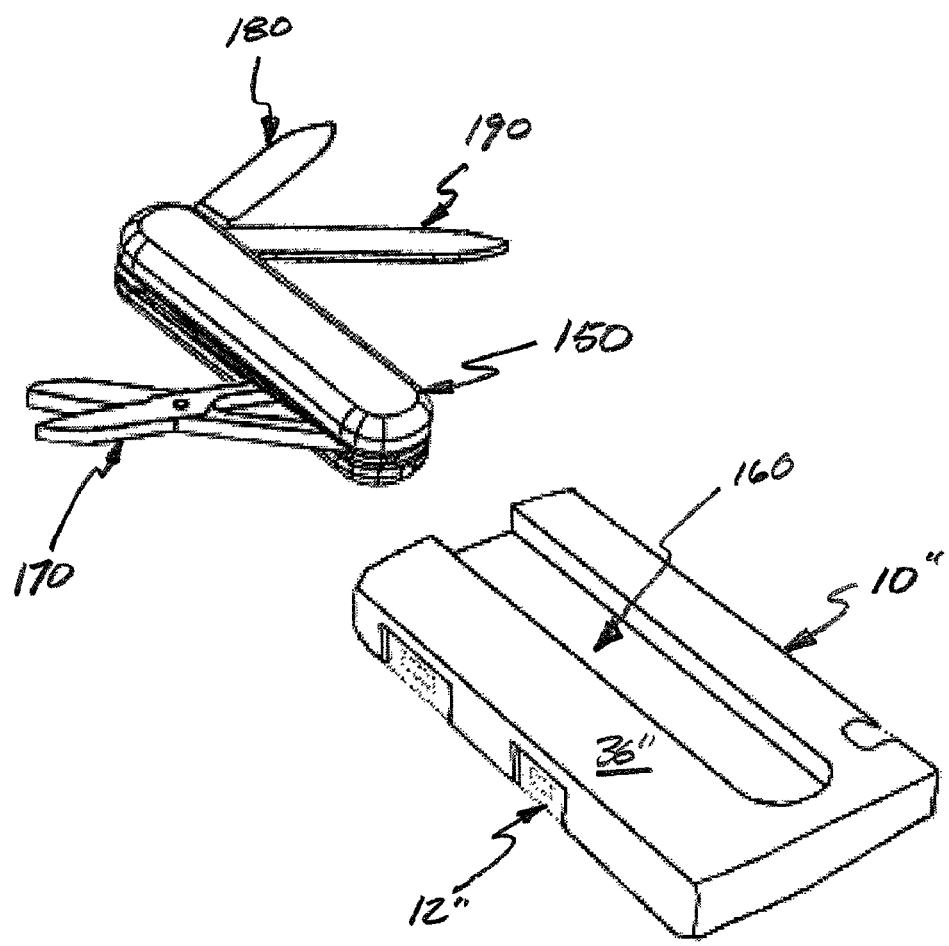

FIGS. 4-6 illustrate another embodiment, which includes container 10", portable electronic device 12", and multifunction tool carrier 150. Container 10" includes compartment or receptacle 160 in rear wall 36" to receive and hold tool carrier 150. Although compartment 160 is shown as a linear slot in FIGS. 4-6, its shape depends upon the shape of tool carrier 150. In some embodiments, compartment 160 may be circular, elliptical, rectangular, trapezoidal, or another shape.

FIG. 4 shows tool carrier 150 nested in compartment 160, with all tools in a retracted position. FIG. 5 shows tool carrier 150 separated from container 10" and portable electronic device 12", but with all tools still in a retracted position.

In FIG. 6, three tools carried by tool carrier 150 (scissors 170, knife blade 180, and nail file 190) are shown in an at least partially deployed position. The number and type of tools can vary, as can the size and shape of tool carrier 150.

The embodiment shown in FIGS. 4-6 can simplify the design of the container, because only a single compartment or receptacle is needed in the container. Instead, the multiple compartments for multiple tools become a part of the design of the tool carrier. The compartment(s) can have a standardized size (or sizes), and interchangeable tool carriers with matching standardized sizes can be used to provide a greater number of options for the user.

Although FIGS. 4-6 show tool carrier 150 as being insertable and removable from compartment 160, in other embodiments tool carrier 150 may be mounted in compartment 160 on a permanent basis. In that case, the tools carried by tool carrier 150 are accessible with tool carrier 150 in place attached to container 10".

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof.

The invention claimed is:

1. A protective container for a portable electronic device, the portable electronic device having a generally rectangular front portion with a display and user input, a generally rectangular rear portion, left and right side portions, and end portions, the protective container comprising:
   a shell shaped to define a cavity to receive and hold the portable electronic device in a form fitting relationship, the shell including a rear wall for covering the rear portion of the device when the device is positioned in the cavity of the shell, left and right side walls that extend from the rear wall for covering the left and right side portions, respectively, of the device, an end wall connected to the rear wall and the left and right side walls for covering one of the end portions of the device, and a front opening through which a user can access the display and user input of the front portion of the portable electronic device, the front opening exposing substantially all of the front portion of the device;
   a plurality of storage compartments formed in the rear wall and having openings near edges of the shell; and
   a plurality of generally flat tools having stored positions within the storage compartments and movable through the openings to deployed positions.

2. The protective container of claim 1, wherein each of the storage compartments extends parallel to the left and right side walls, and each of the openings of the storage compartments has one of a set of three standardized opening sizes.

3. The protective container of claim 2, wherein each of the tools has a standardized tool size that mates with one of the three standardized opening sizes.

4. The protective container of claim 1, wherein at least one of the storage compartments has an opening in the end wall.

5. The protective container of claim 1, wherein at least one of the storage compartments has an opening in one of the left and right side walls.

6. The protective container of claim 1, wherein the deployed positions include a deployed position in which a tool is removed from the shell and a deployed position in which a tool is connected to the shell.

7. The protective container of claim 1, wherein the plurality of generally flat tools includes a tool that is pivotably connected to the shell.

8. The protective container of claim 1, wherein the plurality of generally flat tools includes a tool that is slidably connected to the shell.

9. The protective container of claim 1, wherein the plurality of flat tools includes a tool that is removable from the shell.

10. A protective container for a portable electronic device, the portable electronic device having a generally rectangular front portion with a display and user input, a generally rectangular rear portion, left and right side portions, and upper and lower end portions, the protective container comprising:
    a generally rectangular shell shaped to receive and hold the portable electronic device in a form fitting relationship, the shell including a rear wall for covering a rear portion of the device when the device is positioned in the shell, and left and right side walls that extend from the rear wall for covering the left and right side portions respectively, of the device, a lower end wall connected to the rear wall and the left and right side walls for covering the lower end portion of the device, and a front opening that exposes substantially all of the front portion of the device so that a user can access the display and user input on the front portion of the portable electronic device;
    a plurality of storage compartments formed in the rear wall, each compartment having an opening with an opening size selected from a set of three standardized opening sizes; and
    a plurality of generally flat tools having stored positions within the storage compartments and movable through the openings to deployed positions, each tool being selected from a set of different tools having standardized tool size corresponding to one of the three standardized opening sizes.

11. The protective container of claim 10, wherein the standardized opening sizes and standardized tool sizes are based upon at least one of width, height, or length.

12. The protective container of claim 11, wherein at least one of the tools has a head which defines the standardized tool size for that tool.

* * * * *